(12) United States Patent
Rutter

(10) Patent No.: US 9,129,991 B2
(45) Date of Patent: Sep. 8, 2015

(54) VERTICAL MOSFET TRANSISTOR WITH A VERTICAL CAPACITOR REGION

(71) Applicant: NXP B.V., Eindhoven (NL)

(72) Inventor: Philip Rutter, Stockport (GB)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/249,204

(22) Filed: Apr. 9, 2014

(65) Prior Publication Data

US 2014/0220749 A1  Aug. 7, 2014

Related U.S. Application Data

(62) Division of application No. 13/549,684, filed on Jul. 16, 2012, now Pat. No. 8,735,957.

(30) Foreign Application Priority Data

Aug. 2, 2011  (EP) .................................. 11176349

(51) Int. Cl.
*H01L 27/108* (2006.01)
*H01L 29/94* (2006.01)
(Continued)

(52) U.S. Cl.
CPC ........ *H01L 29/66666* (2013.01); *H01L 25/072* (2013.01); *H01L 27/0733* (2013.01);
(Continued)

(58) Field of Classification Search
CPC .............. H01L 25/072; H01L 27/0733; H01L 29/0661; H01L 29/407; H01L 29/41766; H01L 29/7827; H01L 29/7813; H01L 29/7811; H01L 29/0733; H01L 29/7803; H01L 29/42368; H01L 2924/0002; H01L 27/0629; H01L 27/0635; H01L 27/0647; H01L 27/0652; H01L 27/0658; H01L 27/0716; H01L 27/0755; H01L 27/0777
USPC .......................... 438/243, 270; 257/302, 330
See application file for complete search history.

(56) References Cited

U.S. PATENT DOCUMENTS 4,763,180 A  8/1988  Hwang et al.
5,045,904 A  9/1991  Kobayashi et al.
(Continued)

FOREIGN PATENT DOCUMENTS

CN      102136597 A      7/2011
DE   10 2004 041892 A1   3/2006
EP       1 710 834 A2    10/2006

OTHER PUBLICATIONS

Extended European Search Report for patent appl. No. 11176349.6 (Dec. 29, 2011).

*Primary Examiner* — Brett Feeney
*Assistant Examiner* — James Chin

(57) ABSTRACT

A method to manufacture a vertical capacitor region that comprises a plurality of trenches, wherein the portions of the semiconductor region in between the trenches comprise an impurity. This allows for the trenches to be placed in closer vicinity to each other, thus improving the capacitance per unit area ratio. The total capacitance of the device is defined by two series components, that is, the capacitance across the dielectric liner, and the depletion capacitance of the silicon next to the trench. An increase of the voltage on the capacitor increases the depletion in the silicon and the depletion capacitance as a result, such that the overall capacitance is reduced. This effect may be countered by minimizing the depletion region which may be achieved by ensuring that the silicon adjacent to the capacitor is as highly doped as possible.

14 Claims, 3 Drawing Sheets

Figure 1:
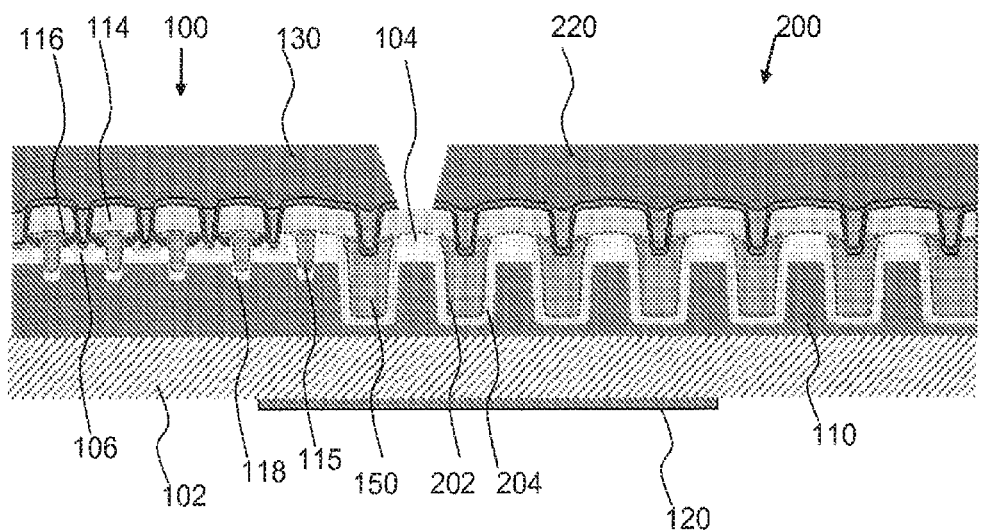

(51) Int. Cl.
  H01L 29/66 (2006.01)
  H01L 29/78 (2006.01)
  H01L 27/07 (2006.01)
  H01L 25/07 (2006.01)
  H01L 29/40 (2006.01)
  H01L 29/417 (2006.01)
  H01L 29/423 (2006.01)
  H01L 29/06 (2006.01)

(52) U.S. Cl.
  CPC ........ H01L29/7803 (2013.01); H01L 29/7811 (2013.01); H01L 29/7813 (2013.01); H01L 29/7827 (2013.01); H01L 29/0661 (2013.01); H01L 29/407 (2013.01); H01L 29/41766 (2013.01); H01L 29/42368 (2013.01); H01L 2924/0002 (2013.01)

(56) References Cited

U.S. PATENT DOCUMENTS

| | | |
|---|---|---|
| 5,324,973 A | 6/1994 | Sivan |
| 5,998,836 A | 12/1999 | Williams |
| 6,037,194 A | 3/2000 | Bronner et al. |
| 6,987,305 B2 | 1/2006 | He et al. |
| 7,633,109 B2 | 12/2009 | Lee et al. |
| 7,667,270 B2 | 2/2010 | Moens et al. |
| 7,705,426 B2 | 4/2010 | Voldman |
| 7,897,997 B2 | 3/2011 | Hsieh |
| 7,948,028 B2 | 5/2011 | Renn |
| 8,304,829 B2 | 11/2012 | Yedinak et al. |
| 8,431,457 B2 | 4/2013 | Chang et al. |
| 8,436,428 B2 | 5/2013 | Micciche' et al. |
| 2004/0232461 A1 | 11/2004 | Huang |
| 2004/0262660 A1 | 12/2004 | Huang |
| 2007/0052013 A1 | 3/2007 | Kim et al. |
| 2007/0224756 A1 | 9/2007 | Lee et al. |
| 2009/0047766 A1 | 2/2009 | Lin |
| 2009/0212843 A1* | 8/2009 | Deboy .................. 327/377 |
| 2009/0242977 A1* | 10/2009 | Kawaguchi et al. .......... 257/330 |
| 2010/0013011 A1* | 1/2010 | Ashrafzadeh ................ 257/341 |
| 2010/0163950 A1 | 7/2010 | Gladish et al. |
| 2010/0314716 A1 | 12/2010 | Mallikararjunaswamy et al. |
| 2011/0024884 A1 | 2/2011 | Xue et al. |
| 2011/0183488 A1 | 7/2011 | Takaishi |
| 2012/0064694 A1* | 3/2012 | Booth et al. .................. 438/390 |
| 2012/0309147 A1* | 12/2012 | Wood et al. .................... 438/270 |
| 2013/0049100 A1* | 2/2013 | Su et al. ........................ 257/329 |

* cited by examiner

VERTICAL MOSFET TRANSISTOR WITH A VERTICAL CAPACITOR REGION

CROSS-REFERENCE TO RELATED APPLICATION

This application is a division of copending application Ser. No. 13/549,684, filed on Jul. 16, 2012, which claims priority under 35 U.S.C. §119 of European patent application no. 11176349.6, filed on Aug. 2, 2011, the contents of which are incorporated by reference herein.

FIELD OF THE INVENTION

The present invention relates to a semiconductor package including a high side MOSFET (metal oxide semiconductor field effect transistor) coupled in series with a low side MOSFET between a first voltage terminal and a second voltage terminal.

The present invention further relates to a PCB (printed circuit board) comprising such a semiconductor package.

BACKGROUND OF THE INVENTION

PCBs typically comprise discrete semiconductor components to achieve the desired functionality of the PCB. This typically includes a voltage regulator, which is used to provide the various components of the PCB with a constant voltage supply to ensure that these components do not display any undesirable behavior resulting from variations in their voltage supply. The voltage regulator may for instance be designed to convert an alternating current into a direct current.

A popular embodiment of such a voltage regulator or power converter is a pair of serially connected power MOSFETs, which are vertical transistors capable of handling much larger currents than the traditional lateral devices.

A limiting factor in the efficiency of a voltage regulator is the time it takes for the drain current to rise and fall within the power MOSFETs used inside the regulator. For a high current voltage regulator, such as those used in computing applications, which typically handle 10 A-30 A per phase, the loss due to the current rise and fall are larger than the losses due to the $Q_{GD}$ of the device, which affects the voltage rise and fall times. The rise and fall times of the current are limited by the source inductance of the control FET, i.e. the high side MOSFET and the total loop inductance, i.e. the inductance path from the input inductor through the two MOSFETs and back to the input inductor.

In order to improve system efficiencies, there is a clear requirement to reduce both package and loop inductance by integrating the two MOSFETs in a single package. The MOSFETs are typically provided on different dies within a single semiconductor package such as a MCM (multi-chip module), with a high side MOSFET having its drain connected to the voltage input and a low side MOSFET having its source connected to ground. Alternatively, the two MOSFETs may be combined with a driver IC (integrated circuit). Such devices are sometimes referred to as DrMOS devices.

In addition to the need to reduce inductance to improve switching speed, the loop inductance is also responsible for generating voltage spikes that can cause problematical EMI, damage to driver and control ICs, and also require higher voltage (i.e. more expensive) power MOSFETs to be used (e.g. for 12V conversion, 30V MOSFETs are standard).

The maximum theoretical di/dt of a half bridge is limited by the formula below, where $L_{tot}$ represents the total loop inductance of the circuit and is the sum of the PCB and package inductances:

$$\frac{di}{dt} = \frac{V_{in}}{L_{tot}}$$

The actually achieved switching speed depends on how quickly the high side MOSFET is switched, which is limited by the magnitude of its package inductance, $L_s$. This is because the source inductance forms part of the gate drive current path and the voltage induced on this inductor acts as a feedback mechanism to reduce switching speed.

In addition to efficiency, voltage overstress is also a concern in devices switching at or close to the theoretical limits. But to the nonlinear capacitance of power MOSFETs voltage spikes can reach 2.5 to 3 times the conversion voltage (so for 12V operation spices in excess of 30V can be achieved). The magnitude of voltage spikes is related to the ratio of source inductance of the high side MOSFET and the total loop inductance. For low spikes $L_s$ needs to be as large a proportion of $L_{tot}$ as possible.

For optimum performance, it is critical to reduce both $L_s$ and $L_{tot}$ whilst ensuring that $L_s$ remains a significant proportion of $L_{tot}$. With package source inductance being of the order of 0.1 nH in some technologies, the source inductance can be removed completely from the gate drive loop, such that it becomes critical to reduce the magnitude of the PCB inductances to improve both performance and voltage spiking behaviour.

The benefits of reducing PCB inductance by using techniques such as the provision of a bypass capacitor in parallel with the MOSFETs to suppress the voltage surges when the voltage regulator turns on to improve its performance are known per se. The bypass capacitor must be placed in close vicinity to the MOSFETs to minimize parasitic inductance and thus improve the efficiency of the voltage surge suppression. For instance, US 2011/0024884 A1 discloses a power converter semiconductor package in which a high-side MOSFET chip is stacked onto a low side MOSFET chip. The insulation between the top source electrode of the low side MOSFET chip and the bottom drain electrode of the high side MOSFET chip is provided by a vertical capacitor sandwiched between the low side MOSFET chip and the high side MOSFET chip, with the bottom electrode of the capacitor electrically connected to the top source electrode of the low side MOSFET chip and the top electrode of the capacitor electrically connected to the bottom drain electrode of the low side MOSFET chip.

This semiconductor package has a number of notable drawbacks. It is complex to manufacture, thus adding to the cost of the package. In addition, the placement of the capacitor in between the MOSFET chips negatively impacts the current flow between these chips as it increases the metal resistance of the low side MOSFET, thus compromising the performance characteristics of the power converter. Moreover, it is difficult to achieve such a capacitor with a sufficiently large capacitance in an economically feasible manner, as for such lateral capacitors the capacitance scales with A/d where A is the plate area and d is the distance between the plates, i.e. the thickness of the dielectric layer. Not only is A relatively small in lateral devices, but d has to be kept relatively large as the dielectric layer must be thick enough to withstand the mechanical forces associated with bonding the upper die onto the lower die.

SUMMARY OF THE INVENTION

The present invention seeks to provide an IC die for a semiconductor package according to the opening paragraph that can be used to overcome at least some of the aforementioned drawbacks.

The present invention seeks to provide a semiconductor package that overcomes at least some of the aforementioned drawbacks.

The present invention further seeks to provide a PCB comprising such a semiconductor package.

The present invention yet further seeks to provide a method for manufacturing such an IC die.

In accordance with a first aspect of the present invention, there is provided an integrated circuit die comprising a substrate separating one of a source and drain region from a semiconductor region, said integrated circuit comprising a vertical transistor region including said source or drain region; a gate electrode formed in a trench extending into said semiconductor region, the gate electrode being electrically insulated from the semiconductor region by a dielectric lining in said trench; and the other of said source or drain region in said semiconductor region; an insulating trench terminating said vertical transistor region; and a vertical capacitor region adjacent to said vertical transistor region, a first plate of said vertical capacitor region comprising the source or drain region separated from the semiconductor region by the substrate, said vertical capacitor region further comprising at least one trench extending into the semiconductor region, said at least one trench comprising an electrically insulating liner material electrically insulating a conductive material defining a second capacitor plate from the first capacitor plate.

Such an IC die can be manufactured in a cost-effective manner, as the process step for forming the trench isolation in the edge region of the vertical MOSFET device to delimit the vertical MOSFET device can be extended to form a plurality of such trenches in another region of the die, i.e. adjacent to the vertical MOSFET device to define a vertical capacitor that has its lower capacitor plate in common with the bottom conductive region of the vertical MOSFET, which may be the source or the drain region of the vertical MOSFET. No additional process steps are required to form such a vertical capacitor, which has the further advantage of a substantially higher capacitance per unit area compared to a lateral capacitor, thus reducing the overall footprint of the capacitor. In addition, as the dielectric liner that electrically insulates the capacitor plates from each other does not need to cope with die mounting stresses, it can be kept relatively thin, thus further increasing the capacitance of the vertical capacitor.

In an embodiment, the vertical capacitor region comprises a plurality of said trenches, wherein the portions of the semiconductor region in between said trenches comprise an impurity. This allows for the trenches to be placed in closer vicinity to each other, thus improving the capacitance per unit area ratio. This can be understood as follows. The total capacitance of the device is defined by two series components, i.e., the capacitance across the dielectric liner, and the depletion capacitance of the silicon next to the trench. An increase of the voltage on the capacitor increases the depletion in the silicon and the depletion capacitance as a result, such that the overall capacitance is reduced. This effect may be countered by minimizing the depletion region, which may be achieved by ensuring that the silicon adjacent to the capacitor is as highly doped as possible.

Preferably, the at least one trench of the vertical capacitor region extends into the substrate, i.e. making the trenches deeper than is required for the MOSFET termination. Since for a vertical MOSFET the substrate is typically heavily doped, the extension of the capacitor trench into the substrate further contributes to the reduction of the depletion capacitance. The drain region of a vertical MOSFET is typically less doped than the substrate, such that for those parts of the drain region that form part of the vertical capacitor it may be advantageous to increase the doping levels in the drain region. This may be achieved via ion implantation, vapor phase doping through the trench sidewall once etched, and so on.

In accordance with another aspect of the present invention, there is provided a semiconductor package a first voltage terminal; a second voltage terminal; a first die comprising a first MOSFET having a drain region electrically connected to the first voltage terminal and further having a source region; and a second die adjacent to the first die, the second die comprising a second MOSFET having a drain region electrically connected to the source region of the first MOSFET and having a source region electrically connected to the second voltage terminal, wherein the first die or the second die is an integrated circuit die according to an embodiment of the present invention, and wherein the one of the plates of the vertical capacitor is electrically connected to the drain region of the first MOSFET and the other of said plates is electrically connected to the source region of the second MOSFET.

The present invention is based on the realization that the total inductance of the circuit formed by the first and second dies can be effectively reduced by integrating the bypass capacitor on one of the dies in which the MOSFET devices are formed. As the bypass capacitor can be easily integrated into the manufacturing process flow without requiring a large increase of processing steps, the manufacturing cost of such a semiconductor package can be reduced compared to the semiconductor package disclosed in US 2011/0024884 A1. Moreover, because the MOSFET dies are placed adjacent to each other, the capacitor has less impact on the current flow through the series connected MOSFETs, thus improving the performance characteristics of the semiconductor package.

Preferably, the vertical capacitor is integrated on the first (high side) MOSFET die such that the drain region of the high side MOSFET also acts as the first plate of the vertical capacitor. As the high side MOSFET, i.e. the control MOSFET, is typically smaller than the second (low side) MOSFET, the capacitor can be formed adjacent, i.e. laterally displaced, to the MOSFET in the same die, thereby reducing the size difference between the two semiconductor dies, which contributes to a particularly compact semiconductor package as the foot print of the package is efficiently utilized.

Alternatively, the source region of the second MOSFET acts as the first plate of the capacitor. In this embodiment, the vertical capacitor is integrated on the second semiconductor die.

The first MOSFET and the second MOSFET each typically comprise a gate electrode. In an embodiment, the package further comprises an integrated circuit comprising a driver circuit electrically connected to the respective gate electrodes. This has the advantage that no separate driver circuit package has to be mounted onto the PCB, thus reducing the risk of component failure as no PCB conductive tracks are required to connect the driver circuit to the MOSFET gate terminals, as well as yielding a more compact PCB. Moreover, this arrangement allows for the driver circuit to be placed in close vicinity of the vertical MOSFETs, thus improving switching speeds.

The integrated circuit may further comprise a pulse width modulation circuit. This has the advantage that a more compact package is obtained as the driver circuit and the PWM circuit are both integrated on the same die. In addition, the integration of the full DC-DC converter functionality on a single die reduces the risk of component mismatch, as all components are designed in the same design process. Alternatively, a further integrated circuit comprising a pulse width modulation circuit may be provided.

According to another aspect of the present invention, there is provided a printed circuit board onto which the semiconductor package of the present invention is mounted.

According to yet another aspect of the present invention, there is provided a method of manufacturing an integrated circuit die according to an embodiment of the present invention, the method comprising providing a semiconductor substrate; forming a first semiconducting layer of a first conductivity type on a first side of the semiconductor substrate; forming a vertical MOSFET by forming a second semiconducting layer of a second conductivity type on a second side of the semiconductor substrate such that the first and second semiconducting regions are separated by the substrate; forming a gate trench in the second semiconducting region, lining said gate trench with a dielectric layer and filling the lined gate trench with a gate electrode material; and forming a semiconducting region of a first conductivity type in the second semiconducting layer adjacent to said gate trench; forming a plurality of trenches through said second semiconducting layer, a first one of said trenches delimiting said vertical MOSFET; filling the first one of said trenches with an electrically insulating material; lining at least one further one of said trenches with an electrically insulating material and filling said lined further one of said trenches with a conductive material, thereby defining a vertical capacitor having the first semiconducting layer as a first plate and the conductive material as a second plate.

This method is based on the insight that a high capacity vertical capacitor may be realized adjacent to a vertical MOSFET in a cost-effective manner by extending the process step for forming the trench insulation structures delimiting the MOSFET to include the formation of a plurality of trenches in which capacitor electrodes or plates are formed, with the first semiconductor layer forming the other plate. The first semiconductor layer preferably comprises a drain region, although alternatively the first semiconductor layer may comprise a source region.

BRIEF DESCRIPTION OF THE EMBODIMENTS

Figure 2:
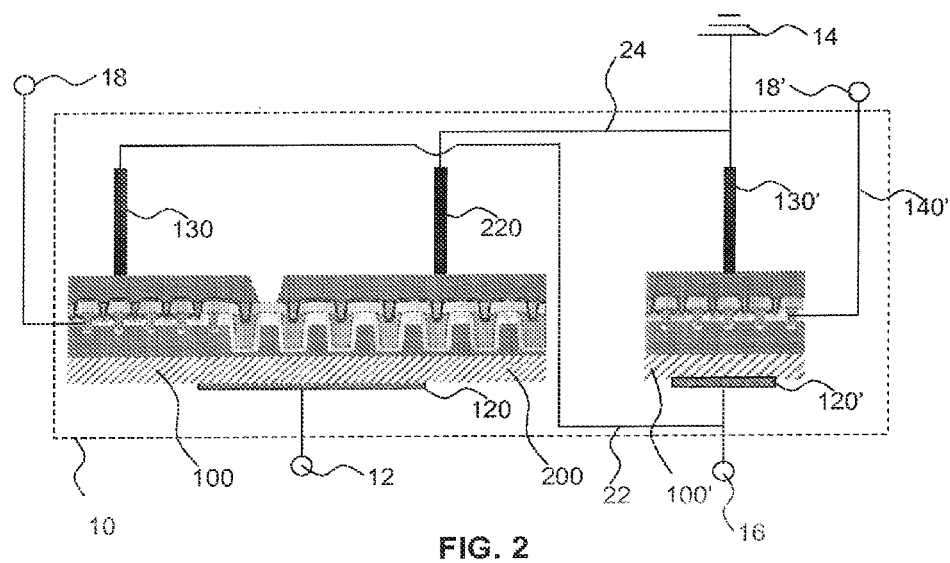
Figure 3:
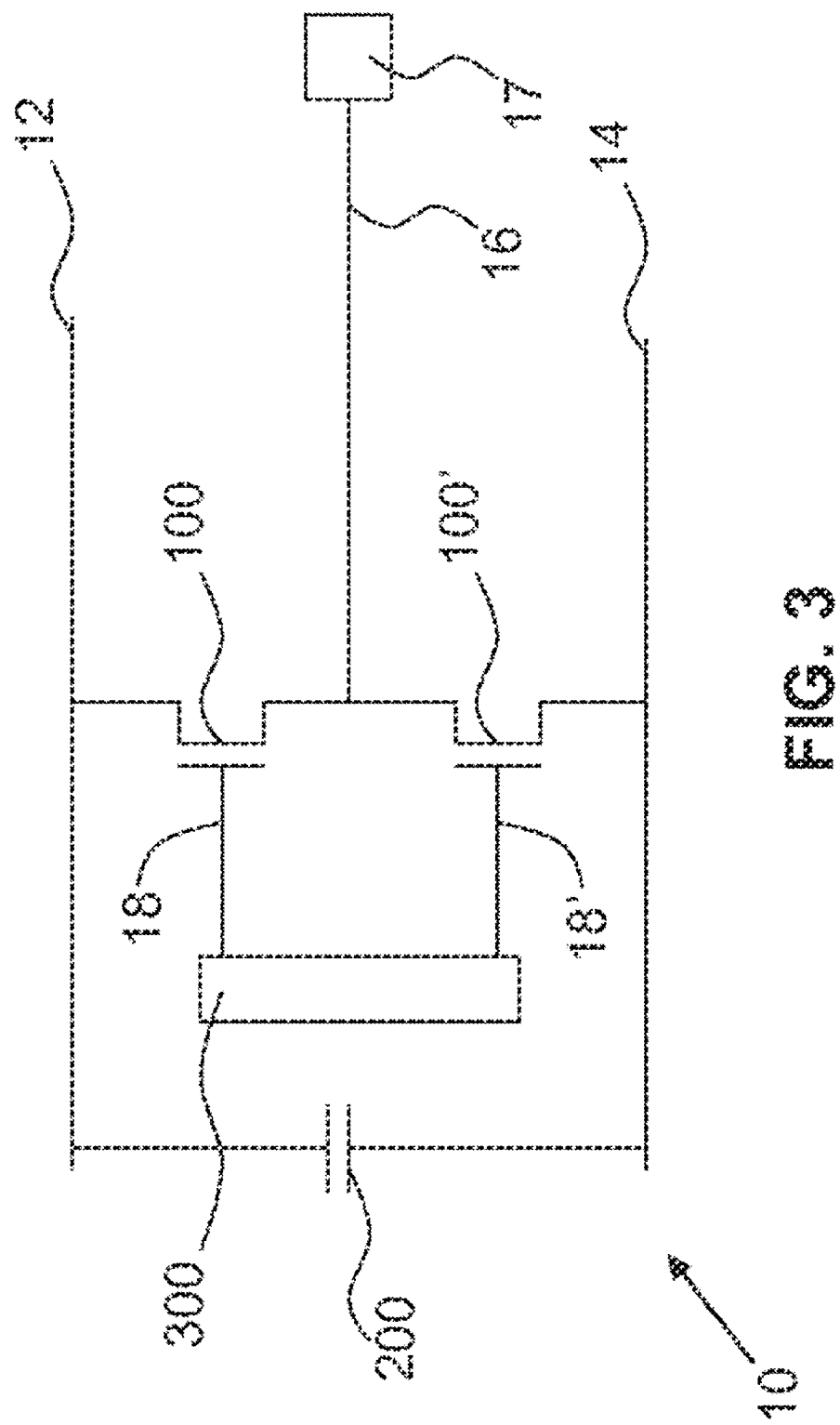
Figure 4:
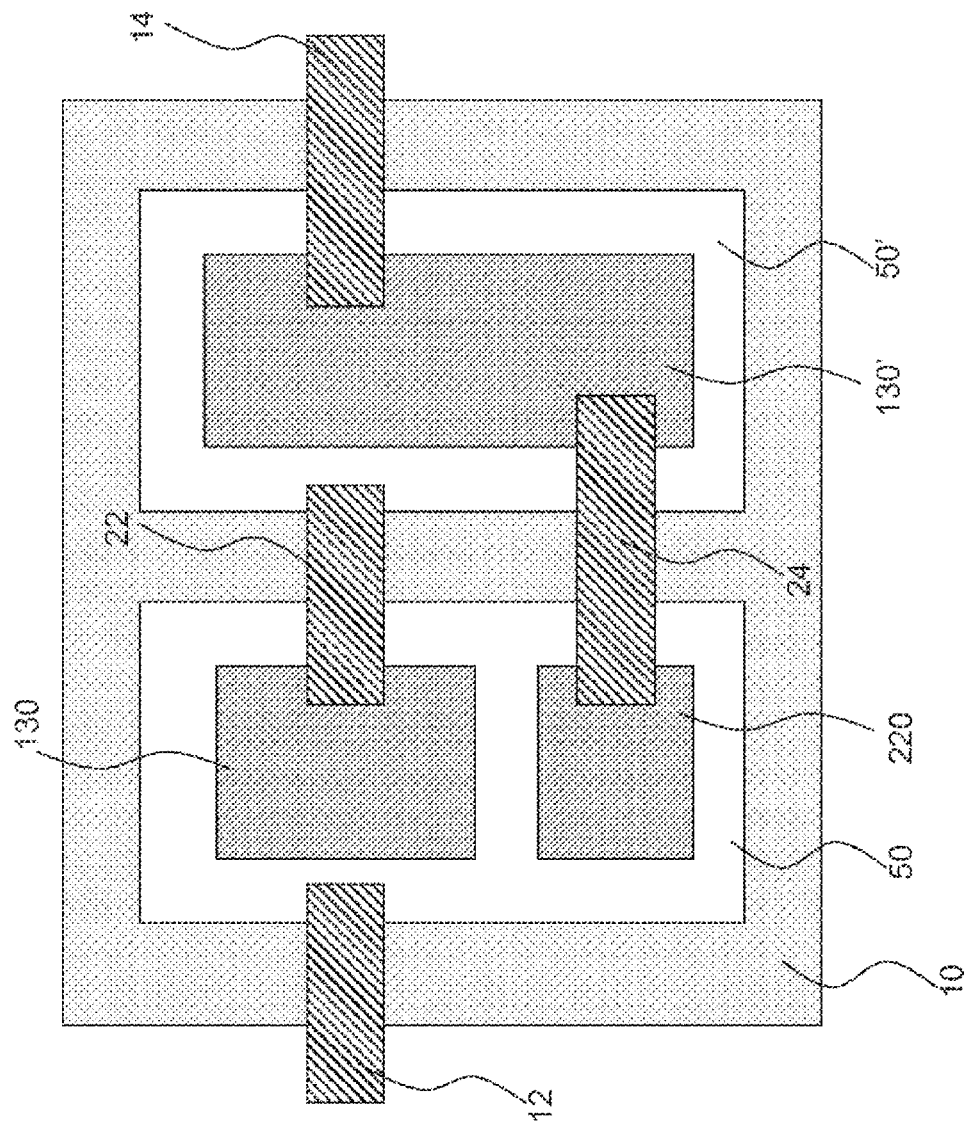

Embodiments of the invention are described in more detail and by way of non-limiting examples with reference to the accompanying drawings, wherein:

FIG. 1 schematically depicts a MOSFET die;

FIG. 2 schematically depicts a semiconductor package according to an embodiment of the present invention;

FIG. 3 schematically depicts a replacement schedule of the semiconductor package of FIG. 2; and FIG. 4 schematically depicts an alternative view of the semiconductor package of FIG. 2.

DETAILED DESCRIPTION OF THE DRAWINGS

It should be understood that the Figures are merely schematic and are not drawn to scale. It should also be understood that the same reference numerals are used throughout the Figures to indicate the same or similar parts.

FIG. 1 shows a non-limiting example of a semiconductor die or chip in which a vertical MOSFET 100 and a vertical capacitor 200 are formed. The vertical MOSFET 100 comprises a drain region 102 and a source region 106 in between which a semiconducting region 104 such as a doped epitaxial silicon region is formed. The drain region 102 and the source region 106 typically comprise an impurity of a type opposite to the impurity type in the semiconducting region 104. The vertical MOSFET 100 comprises vertical gate electrodes 115 in between the drain 102 and the source 106. Source extension regions 116, as well as drain extension regions (not shown) may also be present. These extension regions may be formed in any suitable manner, e.g. by means of an implanting step for the source extension region and a doping step for the drain extension region during the epitaxial growth of the drain region 102. A gate dielectric 118 separates the gate electrode 115 from the vertical channel regions formed in the semiconducting region 104 adjacent to the trench in which the gate electrode 115 is formed.

Further electrically insulating regions 114 are provided to insulate the various electrically conducting parts of the vertical MOSFET from each other.

In accordance with the present invention, the semiconductor die or chip further comprises a vertical capacitor 200 for which one of its plates are formed by the drain region 102. The vertical capacitor 200 is formed in one or more trenches, which are formed in the same processing step as the trenches defining the trench isolation 150 in the edge region of the vertical MOSFET 100, such that these capacitor trenches can be formed without requiring an additional processing step. The capacitor trenches are lined with a dielectric material 204, which may be any suitable dielectric material such as $SiO_2$, $Si_3N_4$, a low-k dielectric and so on, and subsequently filled with a conductive material 202, which forms the second conductive plate of the vertical capacitor 200. The dielectric material 204 together with the substrate 110 typically form the electrical insulation between the capacitor plates. A suitable embodiment of the conductive material 202 is doped polysilicon, although other suitable materials will be immediately apparent to the skilled person.

As the first plate of the vertical capacitor is formed by the drain region 102 of the vertical MOSFET 100 the first plate and the drain region 102 share the same external contact 120. The second plate 202 of the vertical capacitor 200 is connected to a separate external contact 220. Similarly, the source region 106 of the vertical MOSFET 100 is electrically connected to a separate external source contact 130 and the gate electrode 115 is electrically connected to a separate external gate contact (not shown). It will be understood that the vertical capacitor 200 may comprise a plurality of trenches, i.e. a plurality of second plates 202 in order to increase the capacity of the vertical capacitor 200, as shown in FIG. 1.

The above manufacturing process may be amended to increase the capacitance of the vertical capacitor 200, which may for instance be desirable to reduce the area required to achieve the desired capacitance of the vertical capacitor 200. For instance, an additional processing may be introduced in which the semiconducting region 104 is removed from in between the trenches in which the second capacitor plate 202 of the vertical capacitor 200 is formed. This requires an additional mask, such that this embodiment typically requires an assessment of the trade-off between area cost and processing cost.

In an alternative embodiment, the trenches for housing the second capacitor plate 202 may be made as deep as possible, i.e. deeper than what is typically required to provide the electrical insulation for the vertical MOSFET 100 termination, such that the trenches extend into the substrate 110. This increases the surface area of each trench and the trench area density constrained by the doping levels of the surrounding silicon may be increased due to the higher doping levels in the substrate 110, which reduce the depletion capacitance as previously explained. It is noted that a design trade-off may be considered here as a reduction in the thickness of the dielectric lining 204 increases the depletion in the surrounding silicon unless the silicon is very highly doped.

In yet an alternative embodiment, additional impurity regions are implanted in between the trenches of the vertical capacitor 200. These regions should be as highly doped as possible, as this allows for a higher density of trenches and/or a reduction of the thickness of the dielectric liner 202, thus increasing capacitance per unit area.

It should be understood that the layout of the vertical MOSFET 100 and the vertical capacitor 200 have been shown by way of non-limiting example only. Such devices are well-known per se and many suitable variations will therefore be immediately apparent to the skilled person. For instance, although it is preferable that the MOSFET 100 and the capacitor 200 are vertical devices, this is not essential. In addition, the capacitor 200 may have a first plate separate to the drain region 102, in which case the first capacitor plate is electrically connected to the drain region 102. The presence of a separate first plate 202 may be used to increase the plate area and therefore the capacitance of the capacitor 200.

It should further be understood that the device shown in FIG. 1 has been simplified for the sake of clarity only. For instance, the device typically may comprise one or more metallization layers and/or a passivation layer over the MOSFET 100 and the capacitor 200, with the various connections to the external contacts achieved by way of vias or etched openings through the passivation layer.

It is furthermore pointed out that the device of in FIG. 1 may be adapted to act as a low-side die in a semiconductor package, in which case layer 102 may act as the source region and impurity region 106 may act as the drain region.

FIG. 2 schematically depicts an embodiment of a semiconductor package 10 of the present invention. The package 10 comprises the device of FIG. 1 with the drain contact 120 electrically connected to a voltage input 12, such that the vertical MOSFET 100 is used as the high side MOSFET in the package 10. The package 10 further comprises a second MOSFET 100', which preferably also is a vertical MOSFET device, although this is not essential. The second MOSFET 100' forms the low side MOSFET in the semiconductor package 10, and has a source electrode 130' connected to a second voltage terminal 14 such as ground. The gate electrode of the high side MOSFET may be controlled through gate contact 18 and the gate electrode of the low side MOSFET may be controlled through gate contact 18'.

The source connection 130 of the high side MOSFET 100 is electrically connected to a regulated voltage output 16 as well as to the drain connection 120' of the low side MOSFET 100' via a conductor 22, thereby providing a pair of MOSFETs serially connected in a half-bridge configuration between a first voltage terminal 12, e.g. a voltage supply input, and a second voltage terminal 14, e.g. ground. The output 16 is provided in between the serially connected MOSFETs, i.e. in electrical connection with the conductor 22.

The second plate electrode 220 of the capacitor 200 is electrically connected to the source electrode 130' of the low side MOSFET 100 via a further conductor 24, such that the capacitor 200 is arranged as a bypass transistor of the half bridge MOSFET configuration; i.e. the capacitor 200 is coupled between the first voltage terminal 12 and the second voltage terminal 14 in parallel with the series connected MOSFETs 100 and 100'. This is shown in the replacement schedule depicted in FIG. 3. The conductor 22 and the further conductor 24 may be realized in any suitable manner, e.g. as bond wires.

In FIG. 3, the semiconductor package further comprises a driver circuit 300 electrically connected to the gate contacts 140 and 140' of the MOSFETs 100 and 100' respectively. The driver circuit 300, which may be arranged on a separate die, is adapted to control the MOSFETs 100 and 100', thereby providing a voltage regulator package 10. Other components may also be present in the package 10; for instance, the die of the driver circuit 300 may further comprise a PWM circuit, or alternatively a PWM circuit may be added as a separate die. Other suitable additional components will be immediately apparent to the skilled person. As is shown in FIG. 3, the output 16 of the half bridge 22 is typically connected to an external contact 17. This may for instance be the die pad onto which the MOSFETs are mounted, or any other suitable external connection.

It has been estimated that for a package 10 having a di/dt of 5 A/ns and 25 A conduction with an allowed voltage drop of 2 V in the capacitor 200, the capacitor 200 must have a capacitance of around 30 nF. For a trench based vertical MOS capacitor such as the capacitor 200 shown in FIG. 1, such a capacitance may be achieved by a plate area of around 1 mm$^2$ for a device having a 30V breakdown voltage. Smaller capacitors 200 can be achieved at lower breakdown voltages.

It will be appreciated that for vertical MOSFETs 100 and 100', the drain connection 120 and the source connection 120' of the respective MOSFETs will be placed on the die pad of the semiconductor package 10. This is shown in FIG. 4, which shows a top view of the semiconductor package 10 of FIG. 2. The chip comprising the high side MOSFET 100 and capacitor 200 is placed onto a die pad 50 with the drain contact 120 in contact with the conductive die pad 50, e.g. a lead frame, which may be realized in any suitable conductive material. The first voltage terminal 12 is also electrically connected to the conductive die pad 50.

The source contact 130 of the high side MOSFET 100 is connected to the conductive die pad 50' onto which the low side MOSFET 100' is mounted through the conductor 22, e.g. a bond wire. The drain contact 120' of the low side MOSFET 100' is placed onto the conductive die pad 50' such that the conductor 22 electrically connects the source contact of the high side MOSFET 100 with the drain contact of the low side MOSFET 100'. The source contact 130' of the low side MOSFET 100' is connected to the second voltage terminal 14 as well as to the second plate contact 220 of the capacitor 200 via a further conductor 24, e.g. a further bond wire.

At this point, it is noted that any suitable type MOSFET may be used in the half-bridge configuration in the semiconductor package 10 of the present invention. For instance, the MOSFETs 100 and 100' may be n-type or p-type conductive devices. Although vertical transistors are preferred, it is also feasible to use lateral transistors, in particular for the low side MOSFET 100'.

So far, the capacitor 200 has been described as being integrated on the same die as the high side MOSFET 100. This is advantageous because the high side MOSFET 100 acts as the control transistor in a half bridge configuration, which means that it typically has a smaller area than the low side MOSFET 100'. For a semiconductor package 10 with rectangular or square footprint, this means that the capacitor 200 can be readily added to the die of the high side MOSFET 100 without increasing the overall dimensions of the semiconductor package 10 as the additional area of the capacitor 200 is modest, such that the combined area of the high side MOSFET 100 and the capacitor 200 usually will not exceed the area of the die of the low side MOSFET 100'. However, it should be understood that the capacitor 200 may also be integrated on the die of the low side MOSFET 100' without departing from the scope of the present invention.

The semiconductor package 10 may be finished in any suitable manner, e.g. by molding the components in a protective resin such as an epoxy resin.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. A method of manufacturing an integrated circuit die, the method comprising:
   providing a semiconductor substrate;
   forming a first semiconducting layer of a first conductivity type on a first side of the semiconductor substrate;
   forming a vertical MOSFET by:
   forming a second semiconducting layer of a second conductivity type on a second side of the semiconductor substrate such that the first and second semiconducting layers are separated by the substrate;
   forming a gate trench in the second semiconducting layer, lining said gate trench with a dielectric layer and filling the lined gate trench with a gate electrode material; and
   forming a semiconducting region of a first conductivity type in the second semiconducting layer adjacent to said gate trench;
   forming a plurality of trenches through said second semiconducting layer, a first one of said trenches delimiting said vertical MOSFET;
   filling the first one of said trenches with an electrically insulating material;
   lining at least one further one of said trenches with an electrically insulating material and filling said lined further one of said trenches with a conductive material, thereby defining a vertical capacitor having the first semiconducting layer as a first plate and the conductive material as a second plate, wherein the region of the first conductivity type in the second semiconducting layer adjacent the gate trench is a source of the vertical MOSFET and the first semiconducting region is a drain of the vertical MOSFET; and
   electrically isolating the second plate of the vertical capacitor from the source.

2. The method of claim 1, wherein the vertical capacitor comprises a plurality of said trenches, the method further comprising implanting an impurity in between said trenches.

3. The method of claim 1, wherein the step of forming a plurality of trenches comprises extending at least the trenches of the vertical capacitor into the substrate.

4. The method of claim 1, further comprising the step of removing the second semiconducting layer from in between the trenches of the vertical capacitor.

5. The method of claim 4,
   filling the lined gate trench with the gate electrode material includes arranging the gate electrode material, source and drain such that in response to a voltage applied to the gate, a channel that conductively couples the source and drain is created in the semiconductor substrate; and
   wherein removing the second semiconducting layer from in between the trenches of the vertical capacitor including electrically isolating the second plate of the vertical capacitor from the source region, thereby provides the first semiconducting layer as a common drain electrode shared by the vertical MOSFET and the vertical capacitor while electrically isolating the source from the second plate.

6. The method of claim 1, wherein
   filling the lined gate trench with the gate electrode material includes arranging the gate electrode material, source and drain such that in response to a voltage applied to the gate, a channel that conductively couples the source and drain is created in the semiconductor substrate.

7. The method of claim 6, wherein the first semiconducting layer connects the drain and the first plate.

8. The method of claim 6, wherein filling the first one of said trenches with an electrically insulating material includes forming a trench isolation region that electrically laterally isolates a portion of the vertical MOSFET from a portion of the capacitor.

9. The method of claim 6, further including forming the drain and the first plate by doping a contiguous region of the first semiconducting layer.

10. The method of claim 6, further including forming a second vertical MOSFET having a second drain connected to the source via the vertical capacitor.

11. The method of claim 1, wherein forming a semiconducting region of a first conductivity type in the second semiconducting layer adjacent to said gate trench includes forming a source of the vertical MOSFET by doping the second semiconducting layer with an impurity.

12. The method of claim 1, further including doping a contiguous region of the first semiconducting layer, therein forming the first plate and coupling the first plate with the vertical MOSFET.

13. The method of claim 1, further including forming a driver circuit electrically connected to the vertical MOSFET and the vertical capacitor.

14. The method of claim 1, further including forming a second vertical MOSFET with the respective vertical MOSFETS being connected in series via the vertical capacitor.

* * * * *